US012394608B2

(12) United States Patent
Birru et al.

(10) Patent No.: US 12,394,608 B2
(45) Date of Patent: Aug. 19, 2025

(54) CLEANING SYSTEM FOR REMOVING DEPOSITS FROM PUMP IN AN EXHAUST OF A SUBSTRATE PROCESSING SYSTEM

(71) Applicant: LAM RESEARCH CORPORATION, Fremont, CA (US)

(72) Inventors: Krishna Birru, Fremont, CA (US); Gang Liu, Fremont, CA (US); Leonard Kho, San Francisco, CA (US); Anand Chandrashekar, Fremont, CA (US); Gishun Hsu, Fremont, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 631 days.

(21) Appl. No.: 17/252,221

(22) PCT Filed: Jun. 14, 2019

(86) PCT No.: PCT/US2019/037330
§ 371 (c)(1),
(2) Date: Dec. 14, 2020

(87) PCT Pub. No.: WO2019/241718
PCT Pub. Date: Dec. 19, 2019

(65) Prior Publication Data
US 2021/0257194 A1    Aug. 19, 2021

Related U.S. Application Data

(60) Provisional application No. 62/685,532, filed on Jun. 15, 2018.

(51) Int. Cl.
*H01J 37/32*    (2006.01)
*H01L 21/67*    (2006.01)

(52) U.S. Cl.
CPC .. *H01J 37/32862* (2013.01); *H01J 37/32357* (2013.01); *H01J 37/32834* (2013.01); *H01L 21/67017* (2013.01)

(58) Field of Classification Search
CPC .......... H01L 21/67017; H01J 37/32862; H01J 37/32357; H01J 37/32834
(Continued)

(56) References Cited

U.S. PATENT DOCUMENTS 6,187,072 B1 *  2/2001  Cheung ............... C23C 16/4405
                                                                118/715
2002/0144706 A1  10/2002  Davis et al.
(Continued)

FOREIGN PATENT DOCUMENTS

JP    H08013131 A    1/1996
JP    2001131751 A    5/2001
(Continued)

OTHER PUBLICATIONS

International Search Report and Written Opinion of the ISA issued in PCT/US2019/037330, mailed Oct. 8, 2019; ISA/KR.
(Continued)

*Primary Examiner* — Tinsae B Ayalew

(57) ABSTRACT

An exhaust system for a substrate processing system includes a radical generator configured to receive a gas mixture including halogen species and to generate halogen radicals, a first pump to pump exhaust gas from an exhaust outlet of a processing chamber, and a first valve configured to selectively fluidly connect an outlet of the radical generator to the first pump downstream from the outlet of the processing chamber.

17 Claims, 9 Drawing Sheets

(58) Field of Classification Search
USPC .......................................................... 134/56 R
See application file for complete search history.

(56) References Cited

U.S. PATENT DOCUMENTS

| | | | |
|---|---|---|---|
| 2005/0159899 A1* | 7/2005 | Komiyama | C23C 16/4412 |
| | | | 702/24 |
| 2006/0207630 A1* | 9/2006 | Sakai | C23C 16/52 |
| | | | 156/345.43 |
| 2007/0028669 A1 | 2/2007 | Brewster | |
| 2007/0095282 A1* | 5/2007 | Moon | B08B 7/0035 |
| | | | 118/715 |
| 2008/0295867 A1 | 12/2008 | Poh et al. | |
| 2018/0073137 A1 | 3/2018 | Xavier et al. | |

FOREIGN PATENT DOCUMENTS

| | | |
|---|---|---|
| KR | 20040095055 A | 11/2004 |
| KR | 20130026108 A | 3/2013 |
| KR | 1020130090698 A | 8/2013 |
| KR | 20150058739 A | 5/2015 |
| KR | 20180029865 A | 3/2018 |

OTHER PUBLICATIONS

Korean Office Action for Korean Application No. 10-2021-7001322 dated Dec. 13, 2023.

* cited by examiner

CLEANING SYSTEM FOR REMOVING DEPOSITS FROM PUMP IN AN EXHAUST OF A SUBSTRATE PROCESSING SYSTEM

CROSS-REFERENCE TO RELATED APPLICATIONS

This application is a U.S. National Phase Application under 35 U.S.C. 371 of International Application No. PCT/US2019/037330, filed on Jun. 14, 2019, which claims the benefit of U.S. Provisional Application No. 62/685,532, filed on Jun. 15, 2018. The entire disclosures of the applications referenced above are incorporated herein by reference.

FIELD

The present disclosure relates to substrate processing systems, and more particularly to a cleaning system for removing deposits from a pump in an exhaust of a substrate processing system.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to perform etching, deposition, and/or other treatment of substrates such as semiconductor wafers. Example processes that may be performed on a substrate include, but are not limited to, etching, deposition and cleaning processes. During processing, a substrate is arranged on a substrate support, such as a pedestal, an electrostatic chuck (ESC), etc. in a processing chamber of the substrate processing system. A gas delivery system supplies a gas mixture into the processing chamber to treat the substrate. Plasma may be struck to enhance chemical reactions within the processing chamber. An RF bias may also supplied to the substrate support to control ion energy.

Various types of reactive chemistries are used during processing. The reactive chemistries are evacuated from the processing chamber using a turbomolecular pump and a roughing pump. Some of the reactive chemistries may be deposited on internal components of the roughing pump. The deposits are often the result of chemistries that react in the processing chamber, in gas lines between the processing chamber and the pump, or in the pump. Accumulation of deposits in the pump can lead to reduced pumping efficiency or seizure of the pump.

Measures are taken to use reactive chemistries that will not deposit material in the pump. However, if this approach is not possible, the pump is replaced when it fails, which is costly. Alternately, a spare pump is swapped in on a periodic basis while the other pump is wet cleaned.

Another method for reducing pump failures due to deposit formation includes the use of multiple pumps for handling different reactive chemistries. In other words, when a first reactive gas flows, the exhaust gas is output to a first pump. When a second reactive gas flows, the exhaust gas is diverted to a second pump. However, this approach increases the cost of the system due to the addition of the pump, valves and plumbing lines. This approach also does not address situations where the first and second reactive gases need to flow at the same time.

SUMMARY

An exhaust system for a substrate processing system includes a radical generator configured to receive a gas mixture including halogen species and to generate halogen radicals, a first pump to pump exhaust gas from an exhaust outlet of a processing chamber, and a first valve configured to selectively fluidly connect an outlet of the radical generator to the first pump downstream from the outlet of the processing chamber. 1. An exhaust system for a substrate processing system, comprising:

In other features, a mixing bowl is arranged upstream from the first pump and downstream from the outlet of the processing chamber and the first valve is configured to selectively fluidly connect the outlet of the radical generator to a first inlet of the mixing bowl. A second inlet of the mixing bowl is fluidly connected to the exhaust outlet. A second valve is configured to selectively fluidly connect an outlet of the radical generator to the second inlet of the mixing bowl.

In other features, the exhaust system includes a second pump having an inlet fluidly connected to the outlet of the processing chamber and an outlet fluidly connected to the inlet of the mixing bowl. The inlet of the first pump is fluidly connected to an outlet of the mixing bowl. The second pump includes a turbomolecular pump and the first pump is selected from a group consisting of a roughing pump and a dry pump. The mixing bowl includes a trap. The exhaust system further includes a purge gas source and a second valve configured to selectively fluidly connect the purge gas source to the first pump.

In other features, a gas detector is fluidly connected to an outlet of the first pump. A second valve is configured to selectively fluidly connect the outlet of the first pump to an inlet of the gas detector, a third pump is connected to an outlet of the gas detector, and a third valve configured to selectively fluidly connect an outlet of the third pump to an abatement system.

In other features, a substrate processing system includes the exhaust system, a processing chamber, a remote plasma source configured to generate remote plasma and to selectively deliver the remote plasma to the processing chamber, and a controller configured to selectively perform chamber cleaning using the remote plasma source and to perform pump cleaning using the radical generator. The controller is configured to perform the chamber cleaning during a first period and the pump cleaning during a second period. The second period at least partially overlaps the first period. The second period sequentially follows the first period. The first period sequentially follows the second period.

In other features, the controller performs the chamber cleaning after X substrates are processed after a prior chamber cleaning and performs the pump cleaning after Y substrates are processed after a prior pump cleaning, where X and Y are integers greater than one. X is not equal to Y.

In other features, a controller is configured to communicate with the gas detector and to cause the pump cleaning to be performed until a gas concentration of a predetermined gas species is less than a predetermined threshold.

In other features, the substrate processing system includes a purge gas source and a second valve configured to selectively fluidly connect the purge gas source to the first pump. The controller performs chamber cleaning during a first period, pump cleaning during a second period and substrate processing during a third period, the controller supplies purge gas at a first flow rate during at least one of the first period and the second period and at a second flow rate during the third period, and the second flow rate is higher than the first flow rate.

A substrate processing tool includes N processing chambers, where N is an integer greater than one, a radical generator configured to receive a gas mixture including halogen species and to generate halogen radicals, N pumps fluidly connected to exhaust outlets of the N processing chambers, respectively, and N first valves configured to selectively connect an outlet of the radical generator downstream from exhaust outlets of the N processing chambers and upstream from the N pumps, respectively.

In other features, the substrate processing tool further includes a purge gas source and N second valves selectively supplying purge gas to the N pumps, respectively. N gas detectors are configured to sense gas concentrations of at least one gas species in exhaust gases at outlets of the N pumps, respectively. A controller is configured to control the N pumps, the N first valves and the radical generator. The controller performs chamber cleaning of one of the N processing chambers during a first period and pump cleaning for the one of the N processing chambers during a second period. The second period at least partially overlaps the first period. The second period sequentially follows the first period. The first period sequentially follows the second period.

In other features, the controller performs the chamber cleaning after X substrates are processed after a prior chamber cleaning and performs the pump cleaning after Y substrates are processed after a prior pump cleaning, where X and Y are integers greater than one. X is not equal to Y.

In other features, the substrate processing tool further includes a controller configured to control the N pumps, the N first valves and the radical generator. The controller communicates with one of the N gas detectors and performs pump cleaning until a gas concentration of a predetermined gas species sensed by the one of the N gas detectors is less than a predetermined threshold.

In other features, the substrate processing tool further includes a purge gas source and N second valves configured to selectively fluidly connect the purge gas source to the N pumps, respectively. The controller performs chamber cleaning during a first period, pump cleaning during a second period and substrate processing during a third period, the controller supplies purge gas at a first flow rate during at least one of the first period and the second period and at a second flow rate during the third period, and the second flow rate is higher than the first flow rate.

A substrate processing system includes a processing chamber including a gas distribution device and an exhaust outlet, a gas delivery system configured to selectively supply a gas mixture to the processing chamber, a remote plasma source configured to generate remote plasma gas, a first valve configured to selectively supply the remote plasma gas to the gas distribution device, a pump in fluid communication with the exhaust outlet, and a second valve configured to selectively supply the remote plasma gas downstream from the exhaust outlet and upstream from the pump.

In other features, a controller is configured to control the first valve, the second valve, the pump and the remote plasma source. The substrate processing system further includes a purge gas source and a third valve configured to selectively supply purge gas to the pump. A controller is configured to control the first valve, the second valve, the third valve, the pump and the remote plasma source. The controller performs chamber cleaning of the processing chamber during a first period and pump cleaning for the processing chamber during a second period. The second period at least partially overlaps the first period. The second period sequentially follows the first period. The first period sequentially follows the second period.

In other features, the controller performs the chamber cleaning after X substrates are processed after a prior chamber cleaning and performs the pump cleaning after Y substrates are processed after a prior pump cleaning, where X and Y are integers greater than one. X is not equal to Y.

In other features, the substrate processing system further includes a gas detector in fluid communication with an output of the pump. The controller communicates with the gas detector and performs pump cleaning until a gas concentration of a predetermined gas species sensed by the gas detector is less than a predetermined threshold. The substrate processing system further includes a purge gas source and a second valve configured to selectively fluidly connect the purge gas source to the pump, respectively. The controller performs chamber cleaning during a first period, pump cleaning during a second period and substrate processing during a third period, the controller is configured to control the second valve to supplies purge gas at a first flow rate during at least one of the first period and the second period and at a second flow rate during the third period, and the second flow rate is higher than the first flow rate.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

A remote plasma source (RPS) may be used to supply radicals to clean components within a processing chamber. In some examples, the radicals include a halogen species. The radicals typically recombine before reaching a pump located in exhaust lines connected to an outlet of the processing chamber. As a result, the remote plasma source that is used to clean the processing chamber components is not very effective at cleaning the pump and deposits may build up over time.

A cleaning system according to the present disclosure uses a radical generator to generate radicals that are introduced into an exhaust gas line located between the processing chamber and the pump. In some examples, the radical generator generates radicals that are introduced into the exhaust gas line located between a turbomolecular pump and a roughing pump. In some examples, the radical generator includes a plasma source or a microwave source. In some examples, a gas including a halogen species such as fluorine (F), chlorine (Cl), bromine (Br), and/or iodine (I) is supplied to the radical generator to create halogen radicals.

In some examples, a gas including fluorine species is supplied to the radical generator, which dissociates the gas to produce fluorine and fluorine radicals. The fluorine and fluorine radicals are used to clean the pump in-situ without removing the pump. In some examples, the gas including the fluorine species that is supplied to the radical generator includes nitrogen trifluoride ($NF_3$) or another gas including fluorine species such as molecular fluorine ($F_2$), tetrafluoromethane ($CF_4$), or hexafluoroethane ($C_2F_6$).

Pump cleaning efficiency using the systems and methods described herein can be monitored using a gas detector such as an infrared gas detector, an infrared end point detector (IREPD), residual gas analyzer (RGA) or Fourier Transform infrared spectroscopy (FTIR). The gas detector also allows the clean time to be optimized. In other words cleaning is performed until a gas concentration of one or more species fall below one or more predetermined concentrations. In other examples, the cleaning time may be estimated and the gas detector may be omitted.

Figure 1:
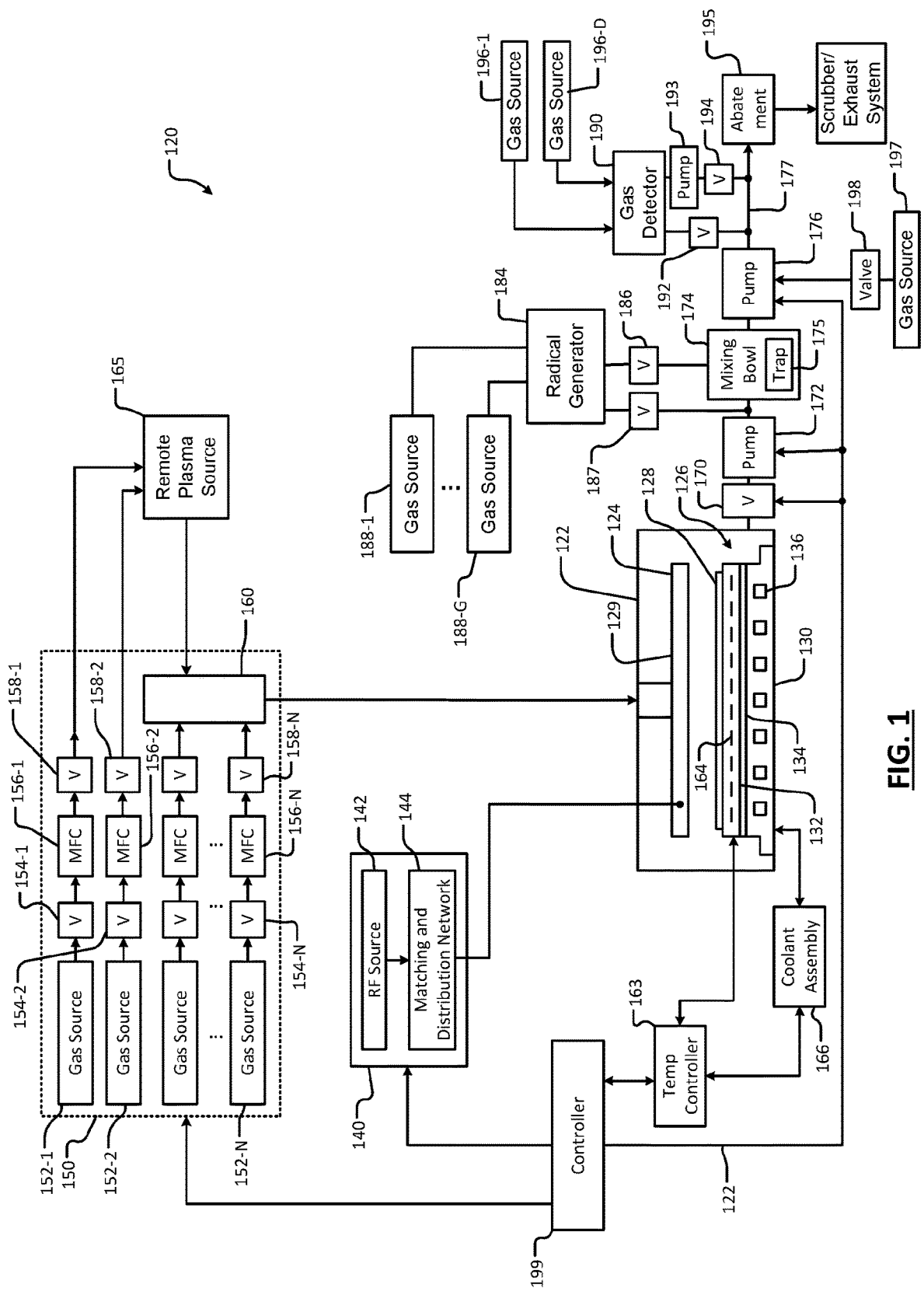
FIG. 1 is a functional block diagram of an example of a substrate processing system including a cleaning system for a pump located in the exhaust according to the present disclosure.

Referring now to FIG. 1, an example substrate processing system 120 is shown. While an example of a processing chamber for etching, chemical vapor deposition or atomic layer deposition (ALD) using capacitively coupled plasma (CCP) and a remote plasma source for chamber cleaning is shown, the systems and methods described herein can be used in other types of substrate processing systems. In some examples, the substrate processing system deposits tungsten (W) using a process gas mixture including tungsten hexafluoride ($WF_6$), diborane ($B_2H_6$), silane ($SiH_4$), argon (Ar) and molecular hydrogen ($H_2$). In some examples, the process gas mixture may further include ammonia ($NH_3$). Cleaning of the pump prevents buildup in the pump and/or failure of the pump.

In FIG. 1, the substrate processing system 120 includes a processing chamber 122 that encloses other components of the substrate processing system 120 and contains the RF plasma (if used). The substrate processing system 120 includes an upper electrode 124 and a substrate support 126 such as an electrostatic chuck (ESC). During operation, a substrate 128 is arranged on the substrate support 126.

For example only, the upper electrode 124 may include a gas distribution device 129 such as a showerhead that introduces and distributes process gases. The gas distribution device 129 may include a stem portion including one end connected to a top surface of the processing chamber. A base portion is generally cylindrical and extends radially outwardly from an opposite end of the stem portion at a location that is spaced from the top surface of the processing chamber. A substrate-facing surface or faceplate of the base portion of the showerhead includes a plurality of holes through which precursor, reactants, etch gases, inert gases, carrier gases, other process gases or purge gas flows. Alternately, the upper electrode 124 may include a conducting plate and the process gases may be introduced in another manner.

The substrate support 126 includes a baseplate 130 that acts as a lower electrode. The baseplate 130 supports a heating plate 132, which may correspond to a ceramic multi-zone heating plate. A thermal resistance layer 134 may be arranged between the heating plate 132 and the baseplate 130. The baseplate 130 may include one or more channels 136 for flowing coolant through the baseplate 130.

If plasma is used, an RF generating system 140 generates and outputs an RF voltage to one of the upper electrode 124 and the lower electrode (e.g., the baseplate 130 of the substrate support 126). The other one of the upper electrode 124 and the baseplate 130 may be DC grounded, AC grounded or floating. For example only, the RF generating system 140 may include an RF source 142 that generates RF power that is fed by a matching and distribution network 144 to the upper electrode 124 or the baseplate 130. In other examples, the plasma may be generated inductively or remotely.

A gas delivery system 150 includes one or more gas sources 152-1, 152-2, . . . , and 152-N (collectively gas sources 152), where N is an integer greater than zero. The gas sources 152 are connected by primary valves 154-1, 154-2, . . . , and 154-N (collectively primary valves 154), MFCs 156-1, 156-2, . . . , and 156-N (collectively MFCs 156) and secondary valves 158-1, 158-2, . . . , and 158-N (collectively secondary valves 158) to a manifold 160. While a single gas delivery system 150 is shown, two or more gas delivery systems can be used.

A temperature controller 163 may be connected to a plurality of thermal control elements (TCEs) 164 arranged in the heating plate 132. The temperature controller 163 may be used to control the plurality of TCEs 164 to control a temperature of the substrate support 126 and the substrate 128. The temperature controller 163 may communicate with a coolant assembly 166 to control coolant flow through the channels 136. For example, the coolant assembly 166 may include a coolant pump, a reservoir and/or one or more temperature sensors. The temperature controller 163 operates the coolant assembly 166 to selectively flow the coolant through the channels 136 to cool the substrate support 126.

A remote plasma source 165 receives one or more gases such as a first gas and a second gas from the gas delivery system 150. For example, the remote plasma source may receive a gas including a halogen species such as $NF_3$ and an inert gas such as argon.

A valve 170 and pump 172 such as a turbomolecular pump may be used to evacuate reactants from the processing chamber 122. A mixing bowl 174 receives an output of the turbomolecular pump 172. A pump 176 is connected to an output of the mixing bowl 174. In some cases, the turbomolecular pump 172 is not used and the mixing bowl 174 receives the output from the processing chamber 122 directly. In some examples, the pump 176 is a dry pump or a roughing pump.

A radical generator 184 is connected by a valve 186 to another input of the mixing bowl 174. The radical generator 184 receives one or more gases from gas sources 188-1, . . . , 188-G, (collectively gas sources 188) where G is an integer greater than zero. In some examples, the gas sources 188 may be supplied by the gas delivery system 150 or another gas delivery system. The radical generator 184 may include a remote plasma source or a microwave. Radicals generated by the radical generator 184 are received by the mixing bowl 174 and flow to an inlet of the pump 176. In some examples, the valve 186 is omitted and purge gas flows through the radical generator 184 to prevent backflow to the radical generator 184 when radicals are not being generated.

In some examples, the mixing bowl 174 is designed to act as a trap 175 to collect process deposits. For example, the mixing bowl 174 can include a tube providing additional volume and surface area to increase formation of deposits on internal surfaces of the mixing bowl 174. As a result, the mixing bowl 174 reduces deposit formation in the pump 176 and increases mean time between pump cleans. The deposits in the mixing bowl 174 can then be cleaned using the radical generator 184. For example, an additional valve 187 and gas lines can be used to flow an output of the radical generator 184 to the mixing bowl 174.

Most of the deposits from the mixing bowl 174 are converted to gas phase and pumped out using the pump 176. In some cases, powder, salt or solid deposits are formed as part of cleaning process. In some examples, the mixing bowl 174 includes the trap 175 to collect the powder, salt or solid deposits formed either during process gas deposition or formed as a result of by-products due to halogen cleaning of the mixing bowl.

An inlet of a gas detector 190 is connected by a valve 192 to a gas line 177 connected to an output of the pump 176 during cleaning to sample gases output therefrom. The output of the pump 176 is also directly connected by the gas line 177 to an abatement device 195. An outlet of the gas detector 190 is also selectively connected by a pump 193 and a valve 194 to the gas line 177 connected to the abatement device 195. The abatement device 195 is connected to a scrubber/exhaust system.

The gas detector 190 receives one or more gases from gas sources 196-1, . . . 196-D, (collectively gas sources 196) where D is an integer greater than zero. For example, the gas detector 190 receives a calibrating gas such as molecular nitrogen ($N_2$), process gases such as tungsten hexafluoride ($WF_6$), nitrogen tri-fluoride ($NF_3$) or another gas including fluorine species such as molecular fluorine ($F_2$), tetrafluoromethane ($CF_4$), or hexafluoroethane ($C_2F_6$) and/or a purge gas (an inert gas such as argon). The pump 176 may also receive one or more gases from a gas source 197 via a valve 198. In some examples, the gas source 197 supplies a purge gas such as molecular nitrogen ($N_2$).

A controller 199 may be used to control the process by controlling components of the substrate processing system 120. More particularly, the controller 199 communicates with the gas delivery system 150, the valves (not all connections shown for clarity), the pumps 172 and 176, and the RF generating system 140 to control operation of the process. The controller 199 also communicates with the temperature controller 163 to control the temperature of the substrate.

Figure 2:
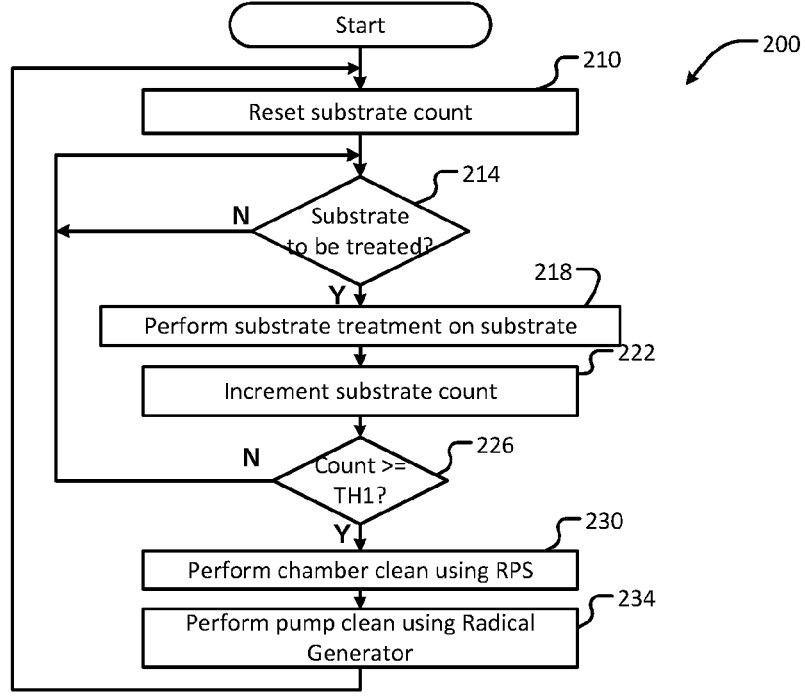
FIG. 2 is a flowchart of an example of a method for cleaning a processing chamber and a pump in the exhaust according to the present disclosure.

Referring now to FIG. 2, a method 200 for operating the cleaning system according to the present disclosure is shown. At 210, a substrate count is reset to zero. At 214, the method determines whether a substrate is to be treated. If 214 is true, the processing chamber performs the substrate treatment on the substrate. At 222, the method increments the substrate count.

At 226, the method compares the count to a predetermined threshold $TH_1$. If the count is greater than or equal to the predetermined threshold $TH_1$, the method performs chamber cleaning using the remote plasma source at 230. At 234, the method performs pump cleaning using the radical generator as described above.

In some examples, the chamber cleaning and the pump cleaning are performed at the same time or in a partially overlapping manner. In other examples, the chamber cleaning and the pump cleaning are performed sequentially. In still other examples, the pump cleaning and the chamber cleaning are performed sequentially. In still other examples, the chamber cleaning and pump cleaning are performed at different intervals and/or different times.

Figure 3:
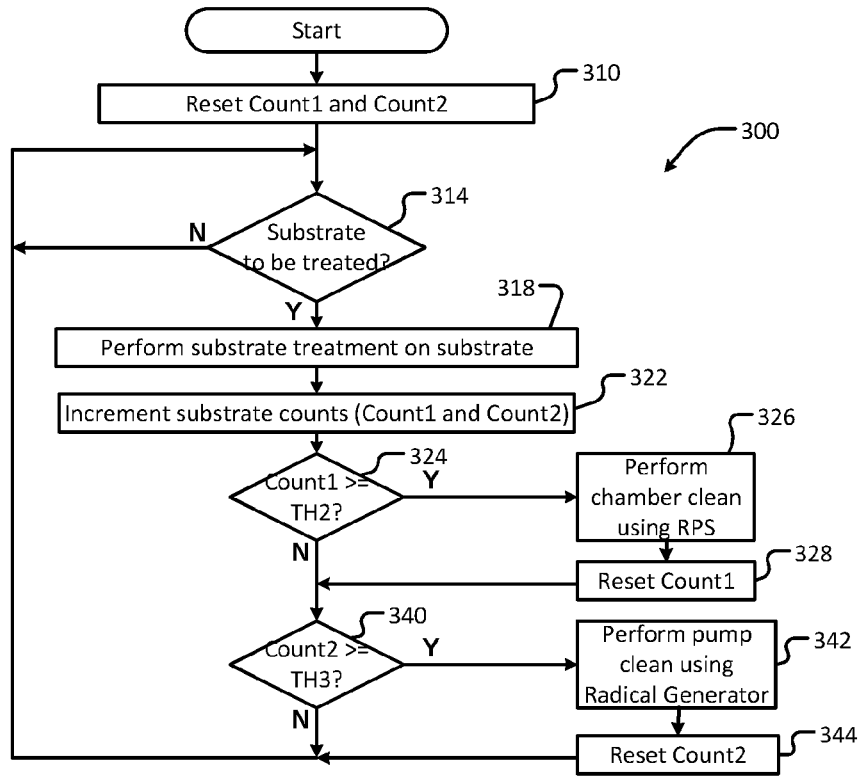
FIG. 3 is a flowchart of another example of a method for cleaning a processing chamber and a pump in the exhaust according to the present disclosure.

Referring now to FIG. 3, another method for operating the cleaning system according to the present disclosure is shown. At 310, a first count (Count1) and a second count (Count2) are reset. At 314, the method determines whether a substrate is to be treated. At 318, the substrate treatment is performed on the substrate. At 322, the substrate counts (Count1 and Count2) are incremented. At 324, the method compares the first count to a predetermined threshold ($TH_2$). If the first count (Count1) is greater than or equal to the predetermined threshold $TH_2$, the method performs chamber cleaning using the remote plasma source at 326. At 328, the first count is reset.

The method continues from 324 (if false) or 328 with 340. At 340, the method compares the second count to a predetermined threshold $TH_3$. If the second count (Count2) is greater than or equal to the predetermined threshold $TH_3$, the method performs pump cleaning using the radical generator and the gas detector. At 344, the second count (Count2) is reset. As can be appreciated, the method in FIG. 3 can be used to perform processing chamber cleaning and pump cleaning at different intervals that are set by the thresholds $TH_2$ and $TH_3$, which can be the same or different.

Figure 4:
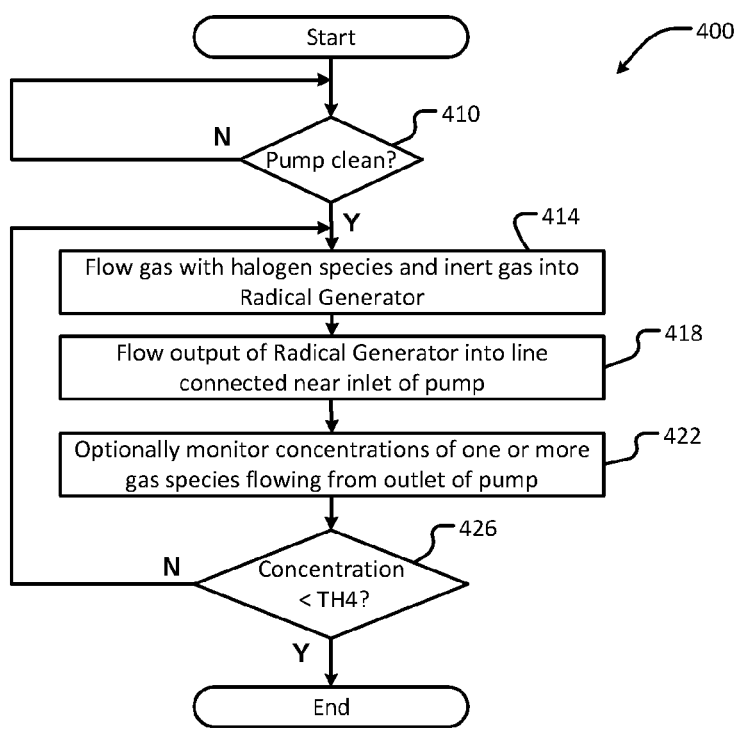
FIG. 4 is a flowchart of an example of a method for cleaning the pump in the exhaust according to the present disclosure.

Referring now to FIG. 4, a method 400 for performing chamber cleaning is shown. At 410, the method determines whether cleaning is needed. At 414, the method supplies a gas mixture including a halogen species to the radical generator and generates halogen radicals. At 418, the output of the radical generator is supplied to a gas line or mixing bowl connected near an inlet of the pump. At 422, the method optionally monitors concentrations of one or more gas species flowing from the outlet of the pump using a gas detector. At 426, the concentration of at least one of the gas species is determined and compared to a predetermined concentration threshold $TH_4$. If the concentration is less than the predetermined concentration threshold $TH_4$, the cleaning is complete and the method ends. Alternately, cleaning may be performed for a predetermined period and the gas detector can be omitted. Otherwise, the method returns to 414.

Cleaning the pump periodically using radicals supplied between the processing chamber and the pump removes the deposits and extends pump life. As a result of the reduced number of pump failures, tool availability and uptime increases. The systems and methods described herein solve the problem of co-flow of reactive chemistries that generally cause deposits to build up in the pump. The systems and methods also provide additional process inputs for process development. Using the gas detector to monitor the clean efficiency or clean time is very useful in optimizing pump cleans for the radical flow, power needed to dissociate the radicals and the time required to clean.

Figures 5A, 5B:
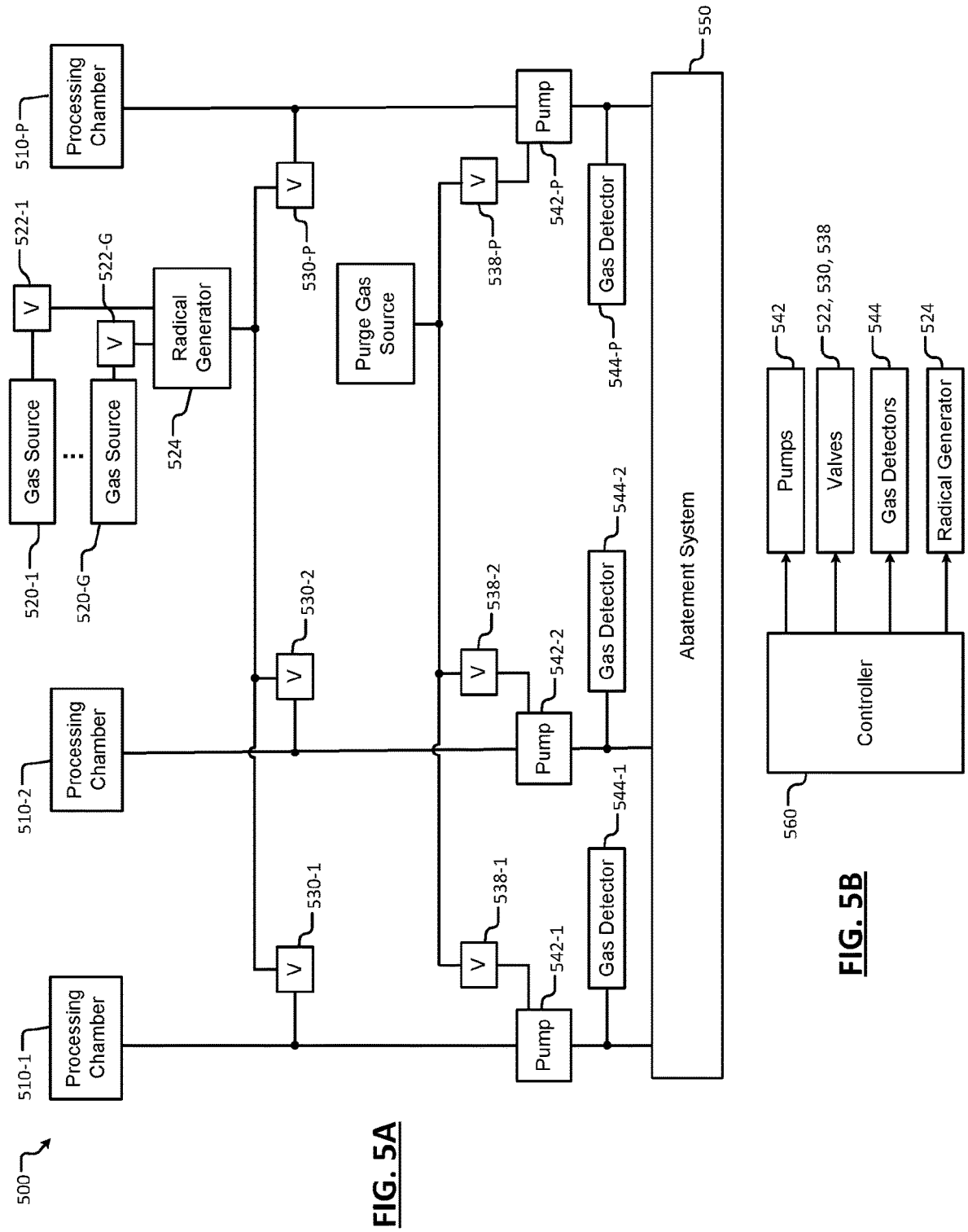
FIGS. 5A and 5B are functional block diagrams of an example of a substrate processing tool including a system for cleaning processing chambers and pumps in the exhaust system according to the present disclosure.

Referring now to FIGS. 5A and 5B, a substrate processing tool 500 includes a plurality of processing chambers 510-1, 510-2, ... and 510-P (collectively processing chambers 510) where P is an integer greater than one. A plurality of gas sources 520-1, ..., and 520-G (collectively gas sources 520) supply one or more gases via valves 522-1, ..., and 522-G (collectively valves 522), respectively, to a radical generator 524.

Gas output by the radical generator 524 is selectively supplied by valves 530-1, 530-1 ..., and 530-P (collectively valves 530), respectively, to gas lines connecting outlets of the processing chamber to inlets of pumps 542-1, 542-2, ... 542-P (collectively pumps 542), respectively. Gas detectors 544-1, 544-2, ... 544-P (collectively gas detectors 544) may be arranged to detect gas composition of gas mixtures flowing from outlets of the pumps 542. The outlets of the pumps 542 are connected to an abatement system 550.

In FIG. 5B, a controller 560 is connected to the pumps 542, the valves 522, 530 and 538, the gas detectors 544 and the radical generator 524 in FIG. 5A. The controller 560 controls operation of the pumps 542 and the radical generator 524. The controller 560 also controls open or closed states of the valves 522, 530 and 538.

Figure 6:
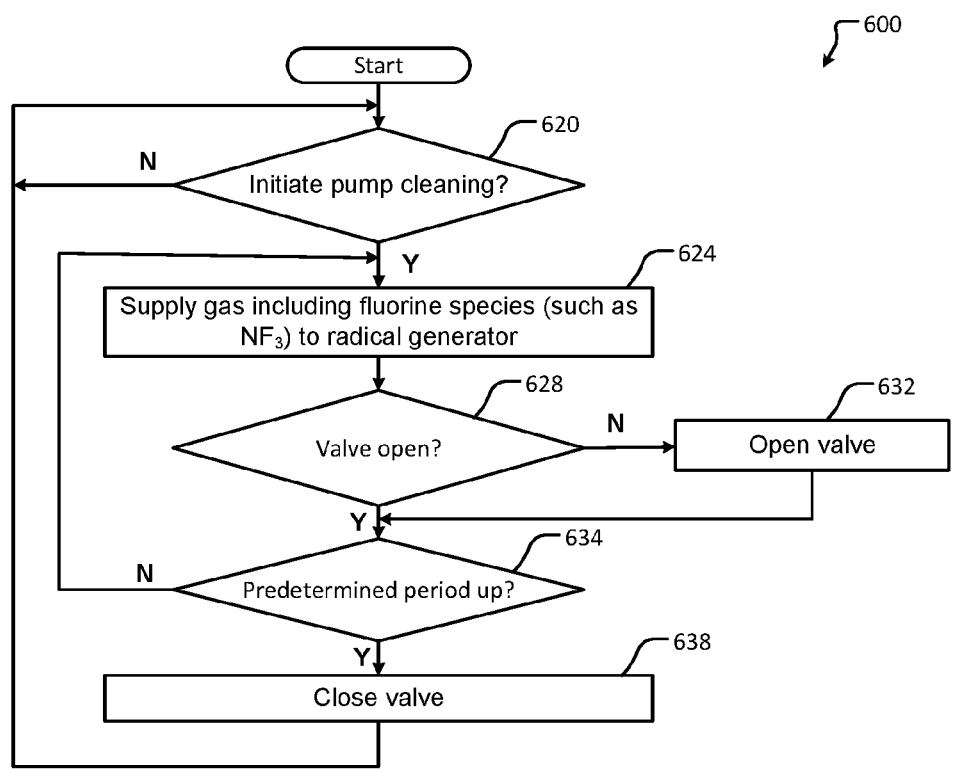
FIG. 6 is a flowchart of an example of a method for cleaning the pumps in the exhaust system of FIGS. 5A and 5B according to the present disclosure.

Referring now to FIG. 6, a method 600 for cleaning the pumps 542 in the exhaust system of the substrate processing tool 500 in FIGS. 5A and 5B is shown. At 620, the method determines whether the tool initiates a cleaning process of the pump and/or the processing chamber. In some examples, the cleaning process of the pump may be performed during, before, or after cleaning of the processing chamber or at other times as previously described.

When 620 is true, the method continues at 624 and supplies a gas or gas mixture including a halogen or fluorine species to a radical generator. In some examples, the gas mixture includes a gas mixture of nitrogen trifluoride ($NF_3$) and argon (Ar), although other gas mixtures including halogen or fluorine species and/or another carrier gas can be used.

At 628, the method determines whether a valve that selectively provides a fluid connection between the radical generator and an inlet of one of the pumps is opened. If 628 is false, the method opens the selected valve located between the radical generator and the inlet of one of the pumps at 632. The method continues from 628 and 632 with 634. At 634, method determines whether a predetermined period for cleaning the pump is over. When 634 is true, the valve located between the radical generator and the inlet of one of the pumps is closed at 638 and the method returns to 620.

Figure 7:
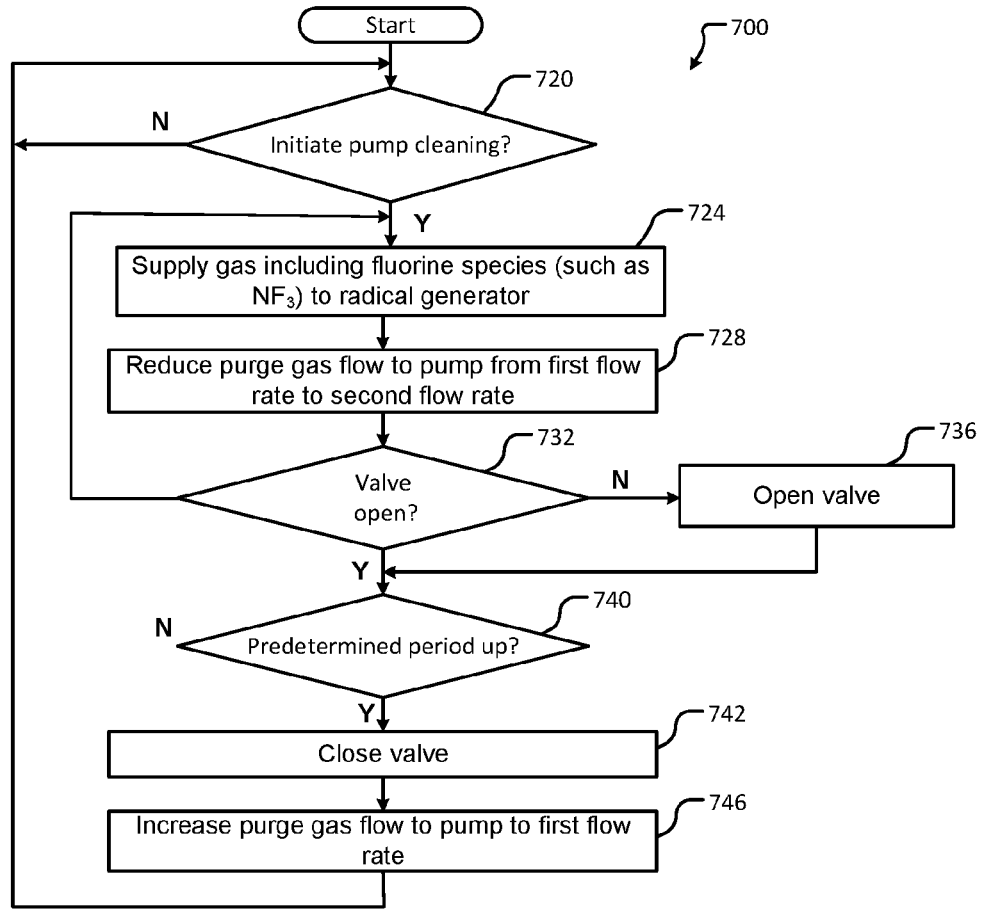
FIG. 7 is a flowchart of another example of a method for cleaning the pumps in the exhaust system of FIGS. 5A and 5B according to the present disclosure.

Referring now to FIG. 7, another method 700 for cleaning the pumps 542 in the exhaust system of the substrate processing tool 500 in FIG. 5A is shown. At 720, the method determines whether the substrate processing tool 500 initiates a cleaning process of the pump and/or the processing chamber. In some examples, the cleaning process of the pump may be performed during, before, or after cleaning of the processing chamber or at other times as previously described.

When 720 is true, the method continues at 724 and supplies a gas or gas mixture including halogen or fluorine species to a radical generator. In some examples, the gas mixture includes a gas mixture of nitrogen trifluoride ($NF_3$) and argon (Ar), although other gases including other halogen or fluorine species and/or another carrier gas can be used. At 728, flow of purge gas to the pump is reduced from a first flow rate to a second flow rate that is lower than the first flow rate. The reduced flow rate allows a longer residence time in the pump for the gas mixture including the halogen or fluorine species, which can increase the effectiveness of pump cleaning or reduce the period required to clean the selected pump.

At 732, the method determines whether a valve providing a fluid connection between the radical generator and an inlet of one of the pumps is opened. If 732 is false, the method opens the selected valve located between the radical generator and the inlet of one of the pumps at 736. The method continues from 732 and 736 with 740. At 740, the method determines whether a predetermined period for cleaning the pump is over. When 740 is true, the valve located between the radical generator and the inlet of the pump is closed at 742. At 746, the flow rate of the purge gas to the pump is increased to the first flow rate and the method returns to 720.

Figures 8A, 8B:
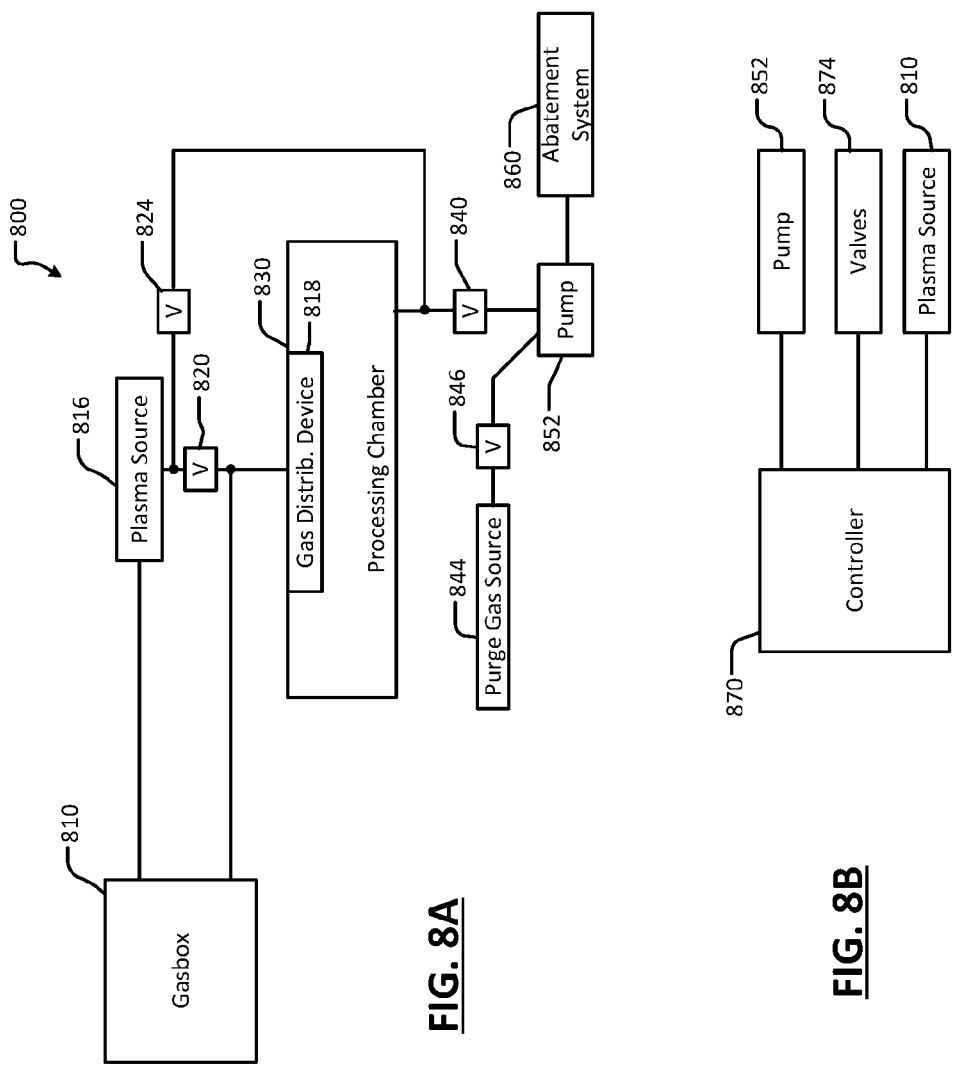
FIGS. 8A and 8B are functional block diagrams of an example of a substrate processing tool including a system for cleaning a pump in the exhaust system according to the present disclosure.

Referring now to FIGS. 8A and 8B, a substrate processing system 800 for cleaning a pump in the exhaust system is shown. The substrate processing system 800 includes a gas box 810 that outputs one or more gases to a plasma source 816 and to a gas distribution device 818 such as a gas injector or showerhead of a processing chamber 830. In some examples, the gas box 810 includes T gas sources connected by T first valves, T mass flow controllers, and T second valves, respectively, to a manifold (where T is an integer greater than one). An output of the plasma source 816 is selectively connected by a valve 820 to the gas distribution device 818. An output of the plasma source 816 is also selectively supplied by a valve 824 to an outlet of the processing chamber 830.

A valve 840 is located between the outlet of the processing chamber 830 and an inlet of a pump 852. A purge gas source 844 supplies purge gas via a valve 846 to the pump 852. An outlet of the pump 852 is fluidly connected to an abatement system 860. In FIG. 8B, a controller 870 controls operation of the pump 852, the valves (collectively identified by reference number 874 in FIG. 8A) and the plasma source 816.

Figure 9:
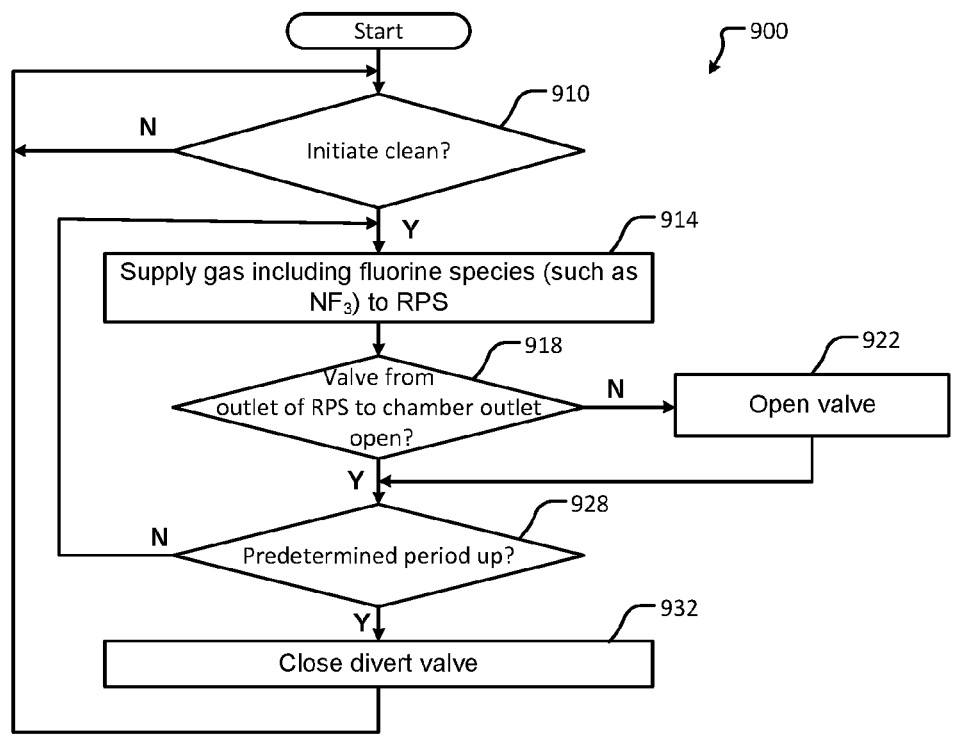
FIG. 9 is a flowchart of an example of a method for cleaning the pumps in the exhaust system of FIGS. 8A and 8B according to the present disclosure.

Referring now to FIG. 9, a method 900 for cleaning the pump 852 in the exhaust system of the substrate processing system 800 in FIGS. 8A and 8B is shown. At 910, the method determines whether the tool initiates a cleaning process of the pump and/or the processing chamber. In some examples, the cleaning process of the pump may be performed during, before, or after cleaning of the processing chamber or at other times as previously described.

When 910 is true, the method continues at 914 and supplies a gas or gas mixture including fluorine species to a plasma source. In some examples, the gas mixture includes nitrogen trifluoride ($NF_3$) and argon (Ar), although other halogen or fluorine species and/or another carrier gas can be used.

At 918, the method determines whether a valve providing a fluid connection between the remote plasma source (RPS) and an outlet of the processing chamber is opened. If 918 is false, the method opens the valve located between the plasma source and the outlet of the processing chamber at 922. The method continues from 918 and 922 with 928. At 928, the method determines whether a predetermined period for cleaning the pump is over. When 928 is true, the valve located between the plasma source and the outlet of the processing chamber is closed at 932 and the method returns to 910.

Figure 10:
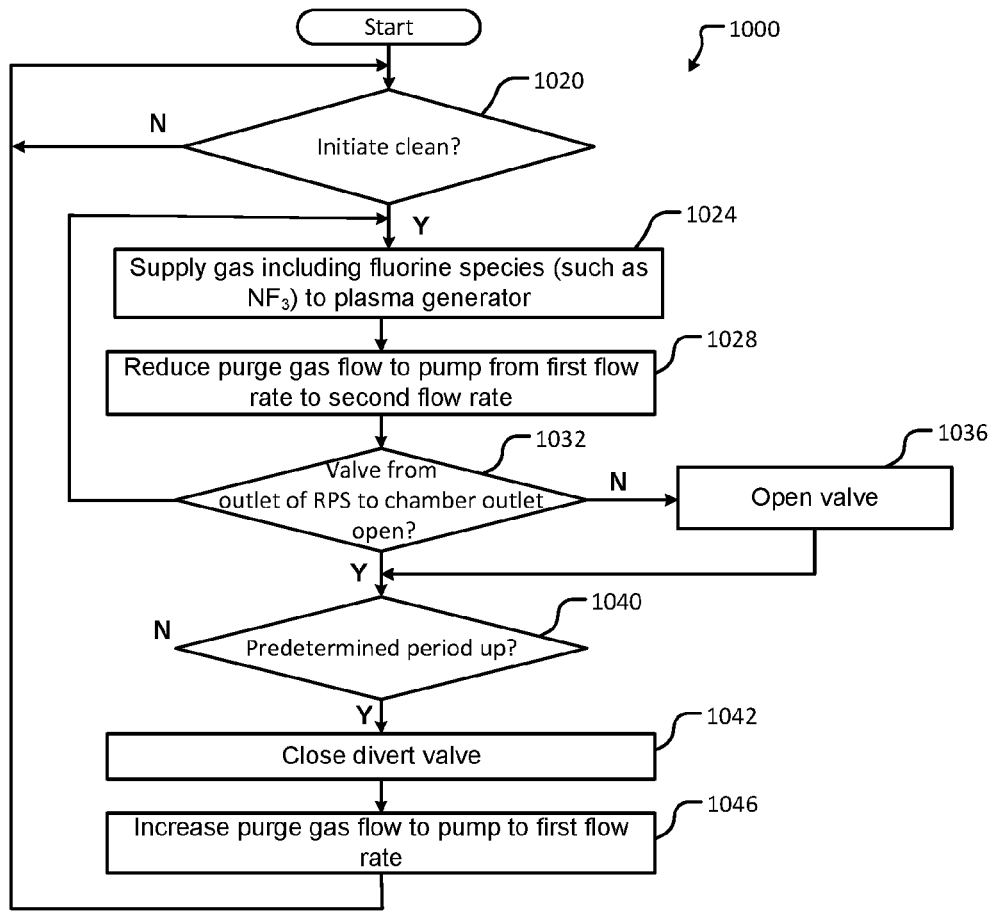
FIG. 10 is a flowchart of an example of another method for cleaning the pumps in the exhaust system of FIGS. 8A and 8B according to the present disclosure.

Referring now to FIG. 10, another method 1000 for cleaning the pump 852 in the exhaust system of the substrate processing system 800 in FIGS. 8A and 8B is shown. At 1020, the method determines whether the tool initiates a cleaning process of the pump and/or the processing chamber. In some examples, the cleaning process of the pump may be performed during, before, or after cleaning of the processing chamber.

When 1020 is true, the method continues at 1024 and supplies a gas or gas mixture including halogen or fluorine species to a plasma source. In some examples, the gas mixture includes a gas mixture of nitrogen trifluoride ($NF_3$) and argon (Ar), although other gases including fluorine species and/or another carrier gas can be used. At 1028, flow of purge gas to the pump 852 is reduced from a first flow rate to a second flow rate that is lower than the first flow rate. The reduced flow rate allows a longer residence time in the pump 852 for the gas mixture including halogen or fluorine species, which can increase the effectiveness of the clean or reduce the period required to clean the selected pump.

At 1032, the method determines whether a valve providing a fluid connection between the plasma source and an outlet of the processing chamber is opened. If 1032 is false, the method opens the selected valve located between the plasma source and the outlet of the processing chamber at 1036. The method continues from 1032 and 1036 with 1040. At 1040, the method determines whether a predetermined period for cleaning the pump is over. When 1040 is true, the valve located between the plasma source and the outlet of the processing chamber is closed at 1042. At 1046, the flow rate of the purge gas to the pump is increased from the second flow rate to the first flow rate and the method returns to 1020.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. An exhaust system for a substrate processing system, comprising:
    a radical generator arranged external to and downstream from a processing chamber, the radical generator configured to receive a gas mixture including halogen species and to generate halogen radicals;
    a mixing bowl separate from the radical generator and connected to the radical generator to receive the halogen radicals from the radical generator, the mixing bowl being a passive component comprising an inlet configured to receive exhaust from the processing chamber and including a structure within the mixing bowl to collect process deposits from the exhaust, the structure providing additional volume and surface area to increase formation of deposits on internal surfaces of the mixing bowl, the mixing bowl configured to convert the process deposits into gas phase using the halogen radicals received from the radical generator;
    a first pump connected to an outlet of the mixing bowl, the first pump configured to pump the process deposits in the gas phase from the mixing bowl, the first pump receiving the halogen radicals from the outlet of the mixing bowl that clean the first pump; and
    a first valve configured to selectively fluidly connect an outlet of the radical generator to the inlet of the mixing bowl;
    wherein a second inlet of the mixing bowl is fluidly connected to the radical generator.

2. The exhaust system of claim 1, further comprising:
    a gas detector fluidly connected to an outlet of the first pump; and
    a controller configured to communicate with the gas detector and to cause cleaning of the first pump to be performed until a gas concentration of a predetermined gas species is less than a predetermined threshold.

3. The exhaust system of claim 1, further comprising a second valve configured to selectively fluidly connect a second outlet of the radical generator to the second inlet of the mixing bowl.

4. The exhaust system of claim 2, further comprising:
    a second pump having an inlet fluidly connected to an exhaust outlet of the processing chamber and an outlet fluidly connected to the inlet of the mixing bowl.

5. The exhaust system of claim 4, wherein the second pump comprises a turbomolecular pump and wherein the first pump is selected from a group consisting of a roughing pump and a dry pump.

6. The exhaust system of claim 1, wherein the structure is a trap.

7. The exhaust system of claim 1, further comprising:
    a purge gas source; and
    a second valve configured to selectively fluidly connect the purge gas source to the first pump.

8. The exhaust system of claim 4, further comprising:
    a second valve configured to selectively fluidly connect an outlet of the first pump to an inlet of the gas detector;
    a third pump connected to an outlet of the gas detector; and
    a third valve configured to selectively fluidly connect an outlet of the third pump to an abatement system.

9. A substrate processing system comprising:
    the exhaust system of claim 1;
    the processing chamber;
    a remote plasma source configured to generate remote plasma and to selectively deliver the remote plasma to the processing chamber; and
    a controller configured to selectively perform chamber cleaning using the remote plasma source and to perform pump cleaning using the radical generator.

10. The substrate processing system of claim 9, wherein the controller is configured to perform the chamber cleaning during a first period and the pump cleaning during a second period.

11. The substrate processing system of claim 10, wherein the second period at least partially overlaps the first period.

12. The substrate processing system of claim 10, wherein the second period sequentially follows the first period.

13. The substrate processing system of claim 10, wherein the first period sequentially follows the second period.

14. The substrate processing system of claim 9, wherein the controller performs the chamber cleaning after X substrates are processed after a prior chamber cleaning and performs the pump cleaning after Y substrates are processed after a prior pump cleaning, where X and Y are integers greater than one.

15. The substrate processing system of claim 14, wherein X is not equal to Y.

16. The substrate processing system of claim 9, further comprising:
    a purge gas source; and
    a second valve configured to selectively fluidly connect the purge gas source to the first pump,
    wherein the controller performs chamber cleaning during a first period, pump cleaning during a second period and substrate processing during a third period, wherein the controller supplies purge gas at a first flow rate during at least one of the first period and the second period and at a second flow rate during the third period, and wherein the second flow rate is higher than the first flow rate.

17. An exhaust system for a substrate processing system, comprising:
- a radical generator external to and downstream from a processing chamber, the radical generator configured to receive a gas mixture including halogen species and to generate halogen radicals;
- a mixing bowl separate from the radical generator and connected to the radical generator to receive the halogen radicals from the radical generator, the mixing bowl being a passive component comprising an inlet configured to receive exhaust from the processing chamber and including a trap within the mixing bowl to collect process deposits from the exhaust, wherein the trap includes a structure that provides additional volume and surface area to increase formation of deposits on internal surfaces of the mixing bowl, the mixing bowl configured to convert the process deposits into gas phase using the halogen radicals received from the radical generator; and
- a first pump connected to an outlet of the mixing bowl, the first pump configured to pump the process deposits in the gas phase from the mixing bowl, the first pump receiving the halogen radicals from the outlet of the mixing bowl to clean the first pump; and
- a first valve configured to selectively fluidly connect an outlet of the radical generator to the inlet of the mixing bowl;

wherein a second inlet of the mixing bowl is fluidly connected to the radical generator.

* * * * *